(12) United States Patent
Kobayashi et al.

(10) Patent No.: US 6,778,030 B2
(45) Date of Patent: Aug. 17, 2004

(54) OSCILLATION CIRCUIT HAVING A POSITIVE FEEDBACK OSCILLATION LOOP AND A SIGNAL SELECTION PART

(75) Inventors: Yoshihiro Kobayashi, Komagane (JP); Nobuyuki Imai, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/197,611

(22) Filed: Jul. 16, 2002

(65) Prior Publication Data

US 2003/0016090 A1 Jan. 23, 2003

(30) Foreign Application Priority Data

Jul. 16, 2001 (JP) .......................... 2001-215918
Dec. 5, 2001 (JP) .......................... 2001-371702

(51) Int. Cl.[7] ............................................... H03B 5/34
(52) U.S. Cl. ................ 331/73; 331/116 R; 331/116 FE
(58) Field of Search .............................. 331/73, 116 R, 331/116 FE, 135, 158

(56) References Cited

U.S. PATENT DOCUMENTS 5,491,604 A * 2/1996 Nguyen et al. ............. 361/278

* cited by examiner

Primary Examiner—Kenneth B. Wells
(74) Attorney, Agent, or Firm—Harness, Dickey & Pierce, P.L.C.

(57) ABSTRACT

An oscillation circuit is provided including a differential amplifier having plural output terminals that provide output signals having different phases from each other, a SAW resonator, and a phase shift circuit, wherein the differential amplifier, SAW resonator, and phase shift circuit forming a positive feedback oscillation loop and a switch circuit being provided for selecting one of the output terminals of the differential amplifier to complete the positive feedback oscillation loop. The switch circuit selects one of the signals SQ1 and SQ2 and transmits it to the phase shift circuit. The phase shift circuit transmits output signals that result from a predetermined phase shift of input signals to the SAW resonator.

31 Claims, 17 Drawing Sheets

PRIOR ART

OSCILLATION CIRCUIT HAVING A POSITIVE FEEDBACK OSCILLATION LOOP AND A SIGNAL SELECTION PART

BACKGROUND OF THE INVENTION

1. Technical Field

The present invention relates to an oscillation circuit exhibiting high frequency oscillation and an electronic device provided with the oscillation circuit.

2. Prior Art

FIG. 18 shows the structural principle of a feedback type oscillator. The feedback type oscillator using a piezoelectric resonator comprises a feedback circuit 101 that consists of a resonator, a phase shift circuit, and wiring for connecting the elements. Among them, the resonator primarily determines the oscillation frequency. An input voltage Vi is applied to the input. The amplifier 100 has a gain G that provides the output voltage Vo at the output that is G times larger than the input voltage Vi. This is expressed by the following equation:

$$Vo=Vi \cdot G.$$

The output voltage Vo is fed back to the input of the amplifier 100 by βVo (not "zero") via a feedback circuit 101 having a voltage feedback rate β. The feedback voltage Vf is expressed by the following equation:

$$V_f = Vo \cdot \beta$$
$$= Vi \cdot G \cdot \beta.$$

When, Vf>Vi and both have the same phase, the positive feedback in which the feedback voltage is larger than the input voltage causes oscillation.

Assuming Vi has a phase θi, Vf has a phase θf, the amplifier G yields a phase shift θG, and the feedback circuit 101 yields a phase shift θβ, then $$V_f e^{j\theta_f} = V_i \cdot G \cdot \beta \cdot e^{j(\theta_i + \theta_G + \theta_\beta)} > V_i e^{j(2\pi + \theta_i)}$$

To satisfy equation (1), the phases must be equal. Therefore, $$\theta_G + \theta_\beta = 2\eta\pi, (\eta=0,1,2,\dots)$$

$$G \cdot \beta > 1$$

The expression (2) is the phase requirement and the expression (3) is the amplitude requirement for the oscillator. Satisfying expressions (2) and (3), causes the feedback type oscillator in FIG. 18 to oscillate.

When the feedback voltage Vf increases high enough to saturate the output voltage Vo of the amplifier 100, this leads to the steady state and stabilized output. The amplitude requirement is then:

$$G \cdot \beta = 1.$$

Piezoelectric oscillation circuits in prior art, employ an amplifier with a high operation performance compared to oscillation frequencies. Therefore, the phase shift rate due to time delay or phase delay can be neglected. The amplifier is considered to be a positive phase or an inverting amplifier for input signals.

The phase shift requirement for the oscillation condition is primarily directed by the phase shift requirement of the resonator and phase shift circuit.

However, high frequency oscillation circuits, particularly those having an oscillation frequency band of 300 MHz or more, undergo a great influence of the phase shift rate of the amplifier and the phase shift rate of wiring that connects other elements besides the phase shift requirement of the resonator and phase shift circuit.

The phase shift rate and the size of the phase shift circuit are correlated. The phase shift circuit may have a problematically large size in association with the required phase shift rate in order to satisfy the phase shift requirement of the oscillation circuit. Larger scale circuits manifest larger deviations in products.

Furthermore, the feedback loop has increased loss and needs to use an amplifier with a larger gain G to satisfy the oscillation requirement, causing influential noise problem.

Required phase shift rates are significantly different between the oscillation circuits if one uses a resonator with a resonation frequency of 155 MHz and the other with 622 MHz. Therefore, a circuit board should be designed for each resonator.

The purpose of the present invention is to provide an oscillation circuit and an electronic device that can easily satisfy the phase requirement of the oscillation loop for a desired oscillation frequency.

SUMMARY OF THE INVENTION

To solve the above problems, the present invention provides an oscillation circuit comprising a differential amplifier having plural output terminals that provide output signals having different phases from each other, a piezoelectric resonator, and a phase shift circuit for transmitting output signals that result from a predetermined phase shift of input signals, wherein the differential amplifier, piezoelectric resonator, and phase shift circuit form a positive feedback oscillation loop, characterized in that a signal selection part for selecting one of the output terminals of the differential amplifier is provided so that the positive feedback oscillation loop is completed with one of the output terminals of the differential amplifier.

In the structure above, for forming the positive feedback oscillation loop by the differential amplifier, piezoelectric resonator, and phase shift circuit, the signal selection part selects one of the output terminals of the differential amplifier to complete the positive feedback oscillation loop.

The present invention further provides an oscillation circuit comprising a differential amplifier having plural output terminals that provide output signals having different phases from each other, a piezoelectric filter, and a phase shift circuit for transmitting output signals that result from a predetermined phase shift of input signals, wherein the differential amplifier, piezoelectric filter, and phase shift circuit forming a positive feedback oscillation loop, characterized in that a signal selection part for selecting one of the plural output terminals of the differential amplifier is provided so that the positive feedback oscillation loop is completed with one of the output terminals of the differential amplifier.

In the structure above, for forming the positive feedback oscillation loop by the differential amplifier, piezoelectric resonator, and phase shift circuit, the signal selection part selects one of the output terminals of the differential amplifier to complete the positive feedback oscillation loop.

In these cases, the differential amplifier can be a differential amplifier having an ECL line receiver. The differential amplifier can have an inverting input terminal and a non-inverting input terminal. Then, the inverting and non-inverting input terminals are connected via an impedance circuit. A bias voltage is applied to one of the inverting and non-inverting input terminals and the other serves as the input terminal of the positive feedback oscillation loop.

The impedance circuit can be a tank circuit having an inductor and a capacitor. Then, the tank circuit selectively passes a desired frequency band of the output signals from the phase shift circuit. Furthermore, the piezoelectric resonator can be a quartz crystal AT cut resonator. Then, the tank circuit selectively passes an odd order overtone oscillation frequency band or desired frequency band of the output signal from the quartz crystal AT cut resonator.

A frequency selection part can be provided that selectively passes certain frequency band components of the output signals from the phase shift circuit. Furthermore, the frequency selection part can have a frequency selection condenser and a frequency selection coil that are connected in parallel. Furthermore, the frequency selection condenser has a variable capacitance to selectively pass the frequency band components of the output signals from the phase shift circuit. Furthermore, the frequency selection condenser can be a condenser that can be laser trimmed. Furthermore, the frequency selection condenser can be a condenser that is patterned on a board and can be laser trimmed. Furthermore, a frequency selection part is provided that selectively blocks frequency band components of the output signals from the phase shift circuit.

The frequency selection part can consist of a variable capacitance condenser provided in the phase shift circuit. The variable capacitance condenser can also be a condenser that can be laser trimmed. Furthermore, the variable capacitance condenser can be a condenser that is patterned on a board and can be laser trimmed. Furthermore, an output buffer circuit having an output differential amplifier can be provided on the output terminal side of the differential amplifier.

Furthermore, the output differential amplifier can be a differential amplifier having an ECL line receiver. Furthermore, a feedback buffer circuit having a feedback differential amplifier with plural output terminals that provide output signals having different phases from each other can be interposed in the positive feedback oscillation loop. Furthermore, the feedback buffer circuit can have a plural number of the feedback differential amplifiers that have the plural output terminals and is connected in parallel. Then, one of the plural feedback output terminals differential amplifiers is interposed in the positive feedback oscillation loop. Furthermore, the feedback buffer circuit can have a plural number of the feedback differential amplifiers that are connected in series. Then, one or a series of feedback differential amplifiers are interposed in the positive feedback oscillation loop.

Furthermore, the feedback differential amplifier can have irregular phase shifts in output signals.

The feedback differential amplifier can also have regular phase shifts for output signals. The feedback differential amplifier can be a differential amplifier having an ECL line receiver. Furthermore, the signal selection part performs the selection for less phase shift at the phase shift circuit. Furthermore, the phase shift circuit can be a voltage controlled phase shift circuit in which the phase shift rate is varied by applied control voltage. The piezoelectric resonator can be a SAW resonator. The SAW resonator can be made of any one of quartz crystal, langasite, and LBO (Lithium Tetraborate). The piezoelectric resonator can be a quartz crystal AT cut resonator. An electronic device can be provided with the oscillation circuit described above.

DETAILED DESCRIPTION OF THE PREFERRED EMBODIMENTS

Preferred embodiments of the present invention are hereinafter described with reference to the drawings.

Embodiment 1

Figure 1:
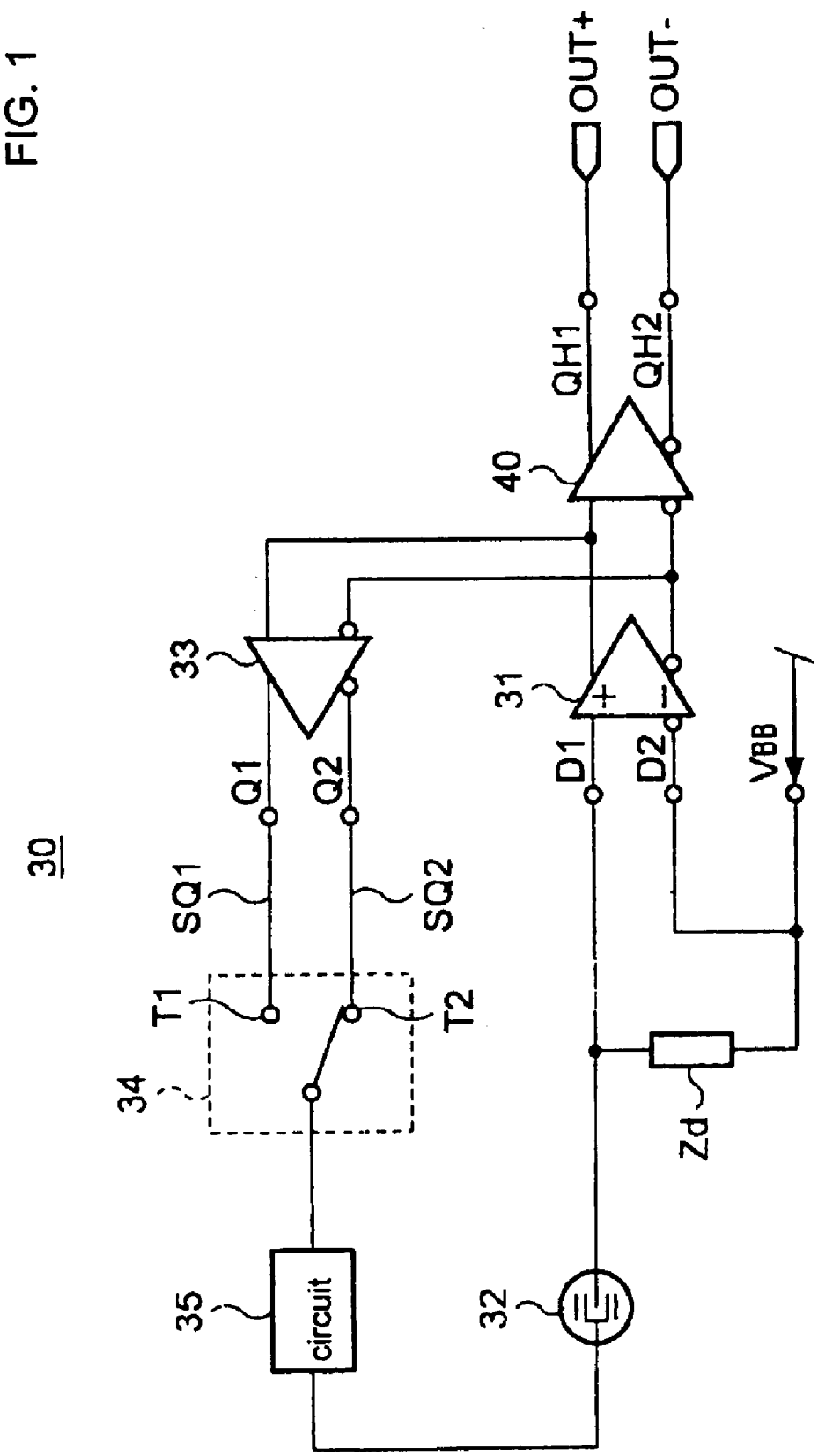
FIG. 1 is a schematic presentation to show the structure of the oscillation circuit of Embodiment 1.

The oscillation circuit of Embodiment 1 is described with reference to FIG. 1. The oscillation circuit 30 is provided with a differential amplifier circuit 31 consisting of an ECL line receiver.

The terminal on the feedback loop downstream side of a SAW (Surface Acoustic Wave) resonator 32 that produces and outputs reference oscillation signals is connected to the non-inverting input terminal D1 of the differential amplifier circuit 31.

A electric potential difference generating circuit Zd (impedance circuit) is interposed between the inverting input terminal D2 of the differential amplifier circuit 31 and the terminal on the feedback loop downstream side of the SAW resonator 32 as a piezoelectric resonator to produce a potential difference between the non-inverting input terminal D1 and inverting input terminal D2 of the differential amplifier circuit 31. A bias voltage VBB is applied to the inverting input terminal D2 of the differential amplifier circuit 31. The non-inverting output terminal D1 of the differential amplifier circuit 31 is connected to the non-inverting input terminal of a buffer circuit (feedback buffer circuit) 33 having a differential amplifier circuit (feedback differential amplifier circuit). The inverting output terminal D1 of the differential amplifier circuit 31 is connected to the inverting input terminal of the buffer circuit 33.

In this case, the output signals that are respectively supplied to the non-inverting and inverting input terminals of the buffer circuit 33 are adjusted to have a phase difference of 180°.

As a result, the output signals SQ1 and SQ2 from the non-inverting and inverting output terminals Q1 and Q2 of the buffer circuit 33, respectively, have a phase difference of 180°.

A switch circuit (signal selection part) 34 for selecting one of the signals SQ1 and SQ2 from the non-inverting and inverting output terminals Q1 and Q2, respectively, is provided downstream of the buffer circuit 33. A phase shift circuit 35 is provided downstream of the switch circuit 34. The switch circuit 34 selects one of the signals SQ1 and SQ2 for a lesser phase shift rate at the phase shift circuit 35. An output buffer circuit 40 having a differential amplifier circuit (output differential amplifier) is provided downstream of the positive and negative output terminals of the differential amplifier circuit 31. How the switch circuit 34 selects the signals is described with reference to FIG. 2. Provision of the buffer circuit 33 and output buffer circuit 40 allows reduced effects on the output of the positive feedback oscillation loop.

Figure 2:
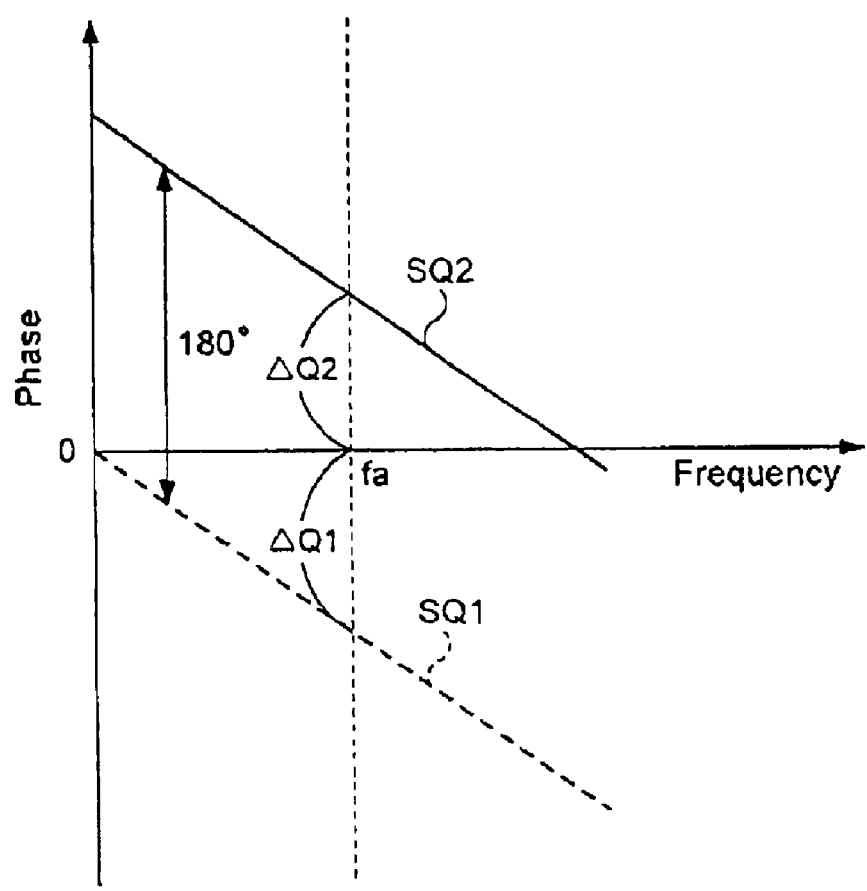
FIG. 2 is a presentation to show the behavior of Embodiment 1.

FIG. 2 is a graph showing the phase shift rate required for the phase shift circuit 35 to satisfy the phase requirement for the entire oscillation circuit 30 when either one of the signals SQ1 and SQ2 is used. Assuming a desired oscillation frequency for the oscillation circuit 30 is fa and the signal SQ1 is used in the feedback loop (positive feedback oscillation loop), the phase shift rate of the phase shift circuit 35 must be $\Delta Q1$ in order to satisfy the phase requirement for the entire feedback loop. The same is true for the signal SQ2. Then, comparing the phase differences $\Delta Q1$ and $\Delta Q2$, the operator switches the switch circuit 34 to the TX terminal (X=1, 2) with which the phase shift circuit 35 covers less shift rate. For instance, when $\Delta Q1 > \Delta Q2$, the switch circuit 34 is connected to the T2 terminal of the inverting output terminal Q2 of the buffer circuit 33. On the other hand, when $\Delta Q1 < \Delta Q2$, the switch circuit 34 is connected to the T1 terminal of the non-inverting output terminal Q1 of the buffer circuit 33. Then, the operator performs an adjustment to cancel the phase difference $\Delta Q1$ (or $\Delta Q2$) at the phase shift circuit 35.

Consequently, the feedback loop consisting of the differential amplifier circuit 31, buffer circuit 33, switch circuit 34, phase shift circuit 35, SAW resonator 32, and potential difference generator circuit Zd satisfies the following phase requirement in which the phase difference between the input and output signals of the differential amplifier circuit 31 is θG and the phase deviation due to the buffer circuit 33, switch circuit 34, phase shift circuit 35, SAW resonator 32, and potential difference generator circuit Zd as well as wiring for connecting these is θβ:

$$\theta G + \theta \beta = 2 \cdot n \cdot \pi (n=0, 1, \ldots).$$

Then, the oscillation circuit 30 is in the oscillation state and produces reference signals at the non-inverting and inverting output terminals QH1 and QH2.

Embodiment 1 of the present invention selects one of the signals SQ1 and SQ2 having different phases from each other from the buffer circuit 33 for less phase shift rate at the phase shift circuit 35. Therefore, the phase shift circuit 35 can be designed to adjust less phase shift rate, allowing a reduced circuit size. This can also reduce the influence of a deviation in the phase shift circuit 35 on products. This also reduces loss in the feedback loop, realizing a highly efficient oscillation circuit.

As is described above, required phase shift rates are significantly different between the oscillation circuits if one uses a resonator with a resonation frequency of 155 MHz and the other with 622 MHz. The same circuit configuration can be used for both although they have the reverse feedback loop. This facilitates designing of the circuit.

This is applicable to high speed network systems such as 10 gigabits Ethernet that allows mass data transfer, for instance, of motion pictures.

Embodiment 2

Figure 3:
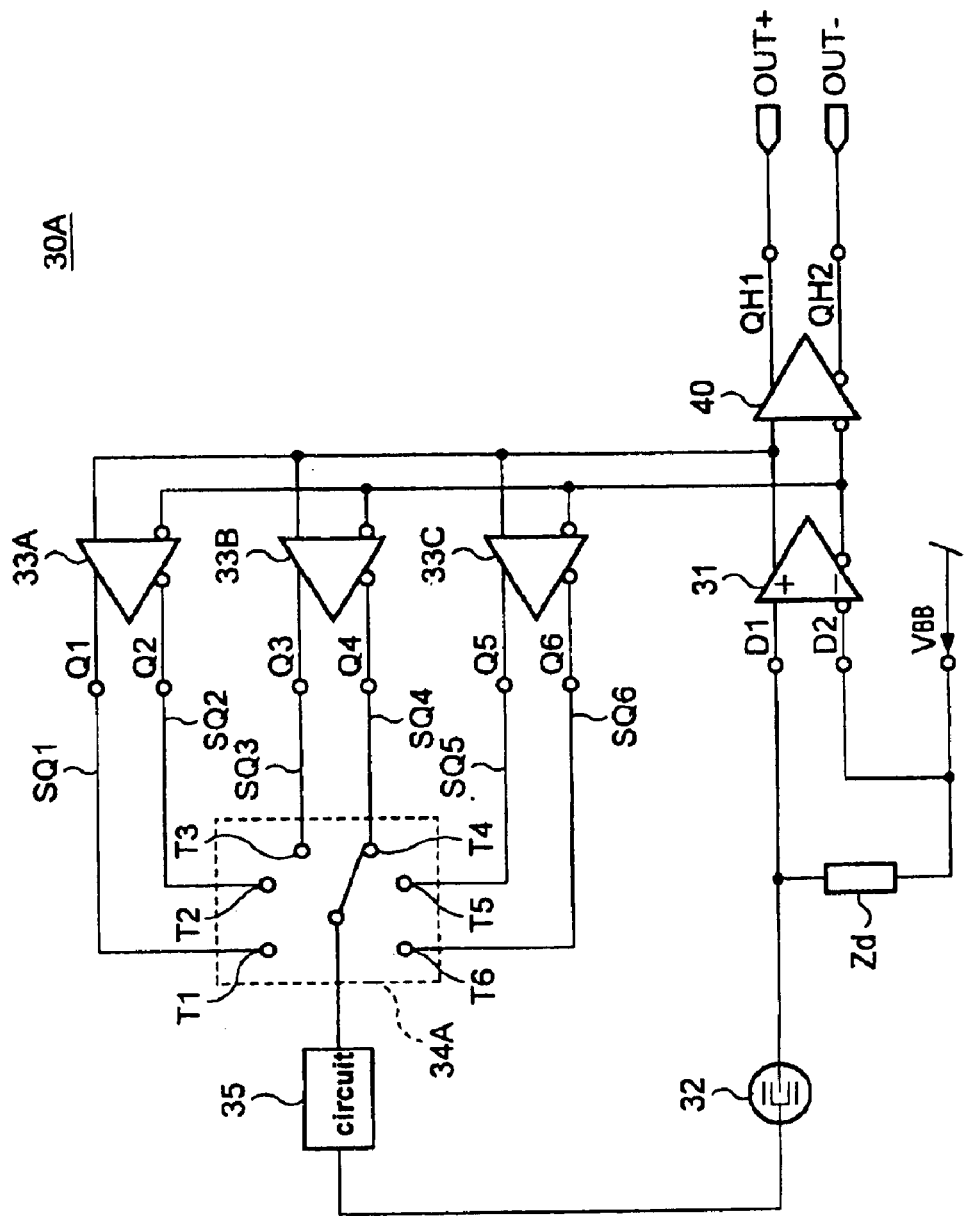
FIG. 3 is a schematic presentation to show the structure of the oscillation circuit of Embodiment 2.

FIG. 3 is a schematic presentation to show the structure of the oscillation circuit 30A of Embodiment 2. In FIG. 3, the same reference numbers are given to the same parts as of Embodiment 1 in FIG. 1 and their detailed explanation is eliminated. The maximum adjustable phase shift rate of Embodiment 1 is approximately 90°. Embodiment 2 uses plural buffer circuits to allow for a smaller maximum adjustable phase shift rate at the phase shift circuit 35. Therefore, the phase shift circuit 35 is smaller in size. This embodiment uses three buffers.

The oscillation circuit 30A differs from the oscillation circuit 30 of Embodiment 1 in that three buffer circuits 33A, 33B, and 33C that form the feedback buffer circuit together are provided in place of the buffer circuit 33, and a switch circuit (signal selection part) 34A for selecting one of signals SQ1, SQ3, and SQ5 from the non-inverting output terminals Q1, Q3, and Q5 and SQ2, SQ4, and SQ6 from the inverting output terminals Q2, Q4, and Q6 is provided downstream of the buffer circuits 33A, 33B, and 33C, respectively.

In this case, the phase difference between the signals SQ1, SQ3, and SQ5 from the respective non-inverting output terminals Q1, Q3, and Q5 and SQ2, SQ4, and SQ6 from the respective inverting output terminals Q2, Q4, and Q6 of the buffer circuit 33A, 33B, and 33C, respectively, is adjusted to be 180°. Here, the phase difference between the signals SQ1 and SQ3 is adjusted to be 60° and the phase difference between the signals SQ1 and SQ5 is adjusted to be 120°.

Figure 4:
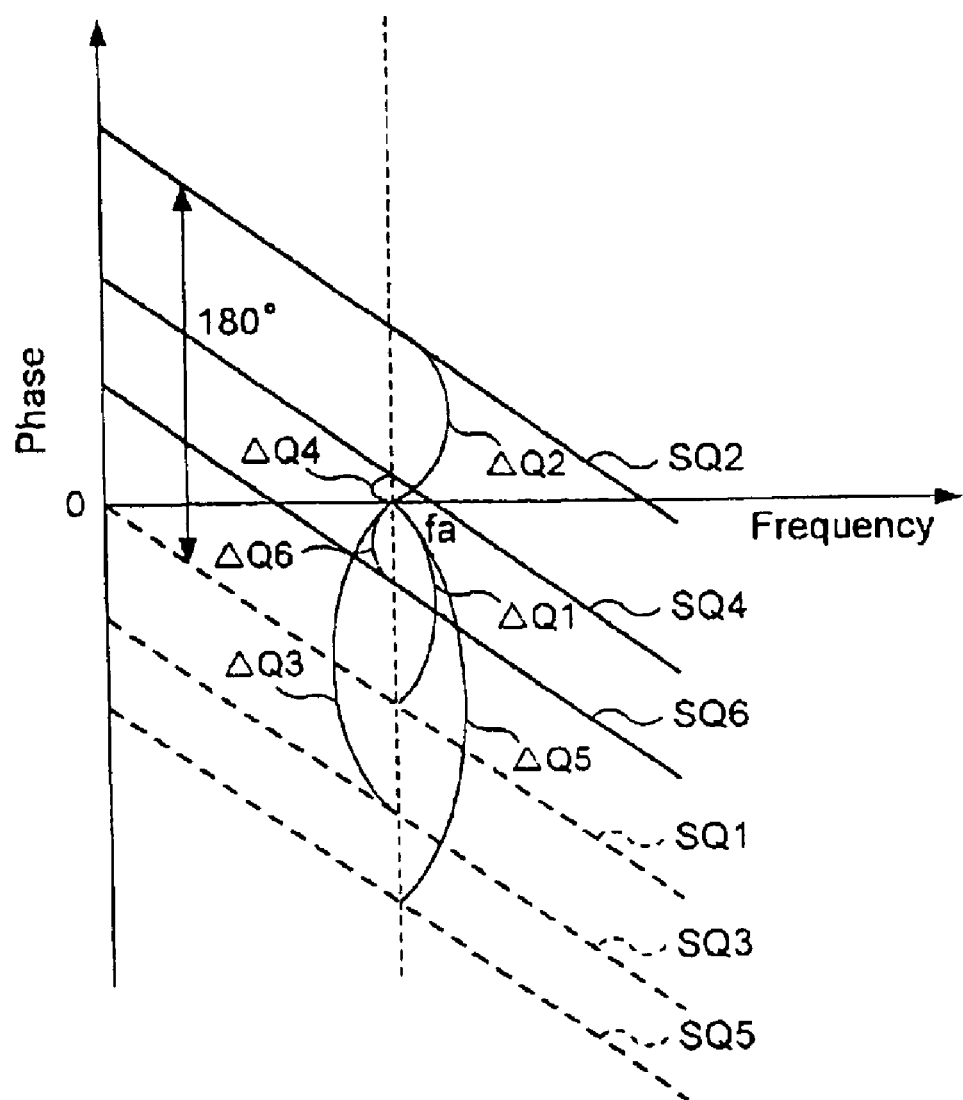
FIG. 4 is a presentation to show the behavior of Embodiment 2.

FIG. 4 shows the phase shift properties of the non-inverting output terminals Q1, Q3, and Q5 and the inverting output terminals Q2, Q4, and Q6 of the buffer circuit 33A, 33B, and 33C in relation to the non-inverting output terminal D1 of the differential amplifier circuit 31. As is shown in FIG. 4, the signals SQ2, SQ4, SQ6, SQ1, SQ3, and SQ5 are regularly shifted by 60° in this order.

Accordingly, as is in Embodiment 1, assuming a desired oscillation frequency is fa, the phase differences $\Delta Q1$, $\Delta Q2$, $\Delta Q3$, $\Delta Q4$, $\Delta Q5$, and $\Delta Q6$ are compared with one another, a signal SQX (X: 1–6) that corresponds to the least phase shift at the phase shift circuit 35 is selected, and the switch circuit 34A is switched to the TX (X: 1–6). For instance, assuming $\Delta Q4 < \Delta Q6 < \Delta Q2 < \Delta Q1 < \Delta Q3 < \Delta Q5$ in FIG. 4, the switch circuit 34A is connected to the inverting output Q4 of the buffer circuit 33B. Then, the operator performs an adjustment to cancel the phase difference $\Delta Q4$ at the phase circuit 35.

Consequently, the feedback loop consisting of the differential amplifier circuit 31, buffer circuits 33A, 33B, and 33C, switch circuit 34A, phase shift circuit 35, SAW resonator 32, and potential difference generator circuit Zd (impedance circuit) satisfies the following phase requirement in which the phase difference between the input and output signals of the differential amplifier circuit 31 is θG and the phase deviation due to the buffer circuit 33, switch circuit 34, phase shift circuit 35, SAW resonator 32 and potential difference generator circuit Zd as well as wiring for connecting these is θβ:

$$\theta G + \theta \beta = 2 \cdot n \cdot \pi (n=0, 1, \ldots)$$

Then, the oscillation circuit 30A is in the oscillation state and produces reference signals at the non-inverting and inverting output terminals QH1 and QH2.

As is described above, Embodiment 2 allows the phase shift circuit 35 to cover a smaller adjustable phase shift range compared to Embodiment 1. Therefore, highly accurate adjustment is available. Furthermore, the phase shift circuit 35 can be further reduced in size.

The case in which three buffer circuits are used is explained above. However, this is not restrictive and any number of buffer circuits can be provided. Here, one of the buffer circuits is selected to complete the feedback loop and the buffer circuits produce output signals the phases of which are shifted at a regular interval. However, the output signals can be shifted at any intervals. They can be at irregular intervals as far as they differ from one another, achieving the same result. The buffer circuit or the feedback loop is selected for output signals having the least phase shift with the phase shift circuit.

Embodiment 3

Figure 5:
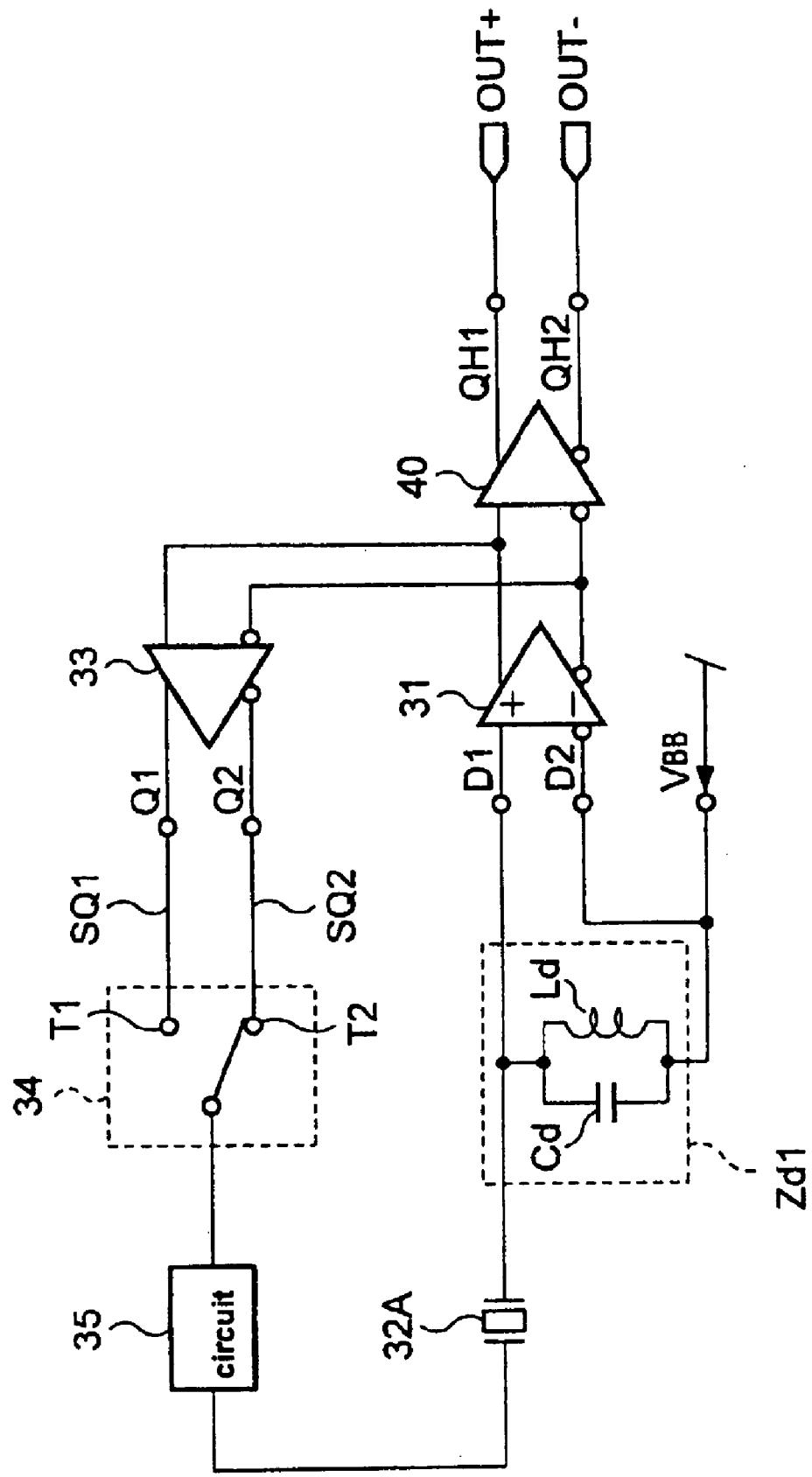
FIG. 5 is a schematic presentation to show the structure of the oscillation circuit of Embodiment 3.

FIG. 5 is a schematic presentation to show the structure of the oscillation circuit of Embodiment 3. In FIG. 5, the same reference numbers are given to the same parts as of Embodiment 1 in FIG. 1 and their explanation is eliminated.

Embodiment 3 uses an AT cut quartz crystal resonator, which is a piezoelectric resonator, in place of the SAW resonator and, here, odd order overtones (for instance, third, fifth, seventh, . . . overtones) are employed. Embodiment 3 also prevents defective oscillations, which are not at a desired frequency fa.

Figure 6:
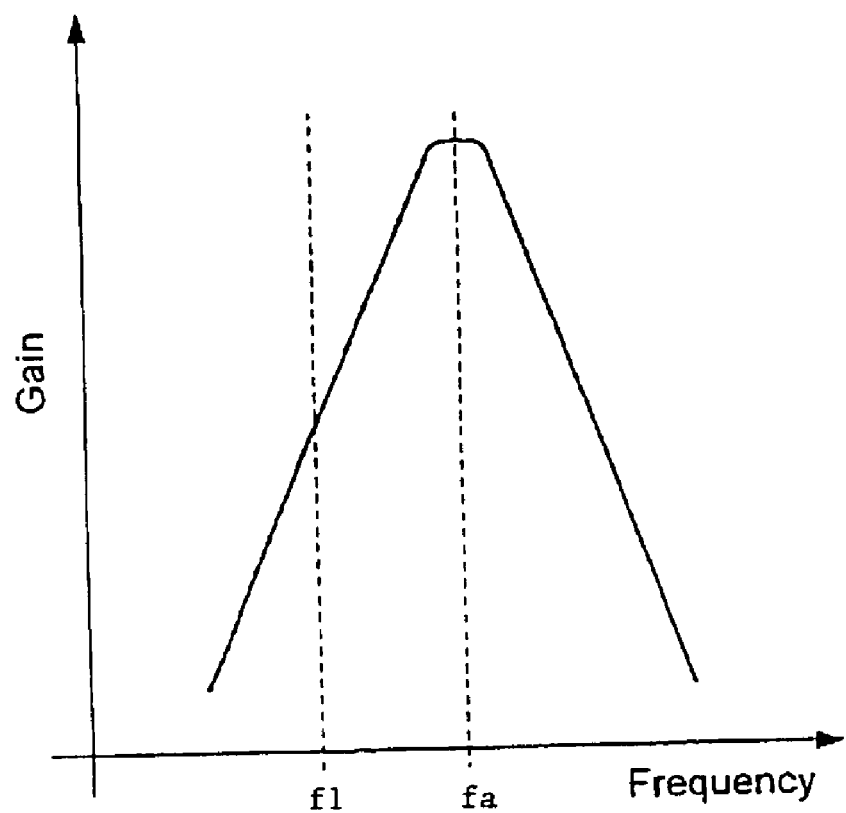
FIG. 6 is a presentation to show the behavior of Embodiment 3.

Embodiment 3 differs from Embodiment 1 in using, as is shown in FIG. 5, a frequency selection circuit (band pass filter) Zd1 for selectively passing a desired oscillation frequency band that is a tank circuit consisting of a condenser Cd (frequency selection condenser; capacitor) and a coil Ld (frequency selection coil; inductor) that are coupled in parallel in place of the potential difference generator circuit Zd (impedance circuit), and using an AT cut quartz crystal resonator 32A in place of the SAW resonator. As is shown in a graphical presentation of the feedback loop gain—frequencies property in FIG. 6, the feedback loop has high gain around the desired oscillation frequency fa, achieving stabilized oscillation. The feedback loop has low gain at other frequencies, for instance at the frequency f1 that corresponds to the third overtone while the fifth overtone of the AT cut quartz crystal resonator 32A is used. This prevents defective oscillations.

Embodiment 4

Figure 7:
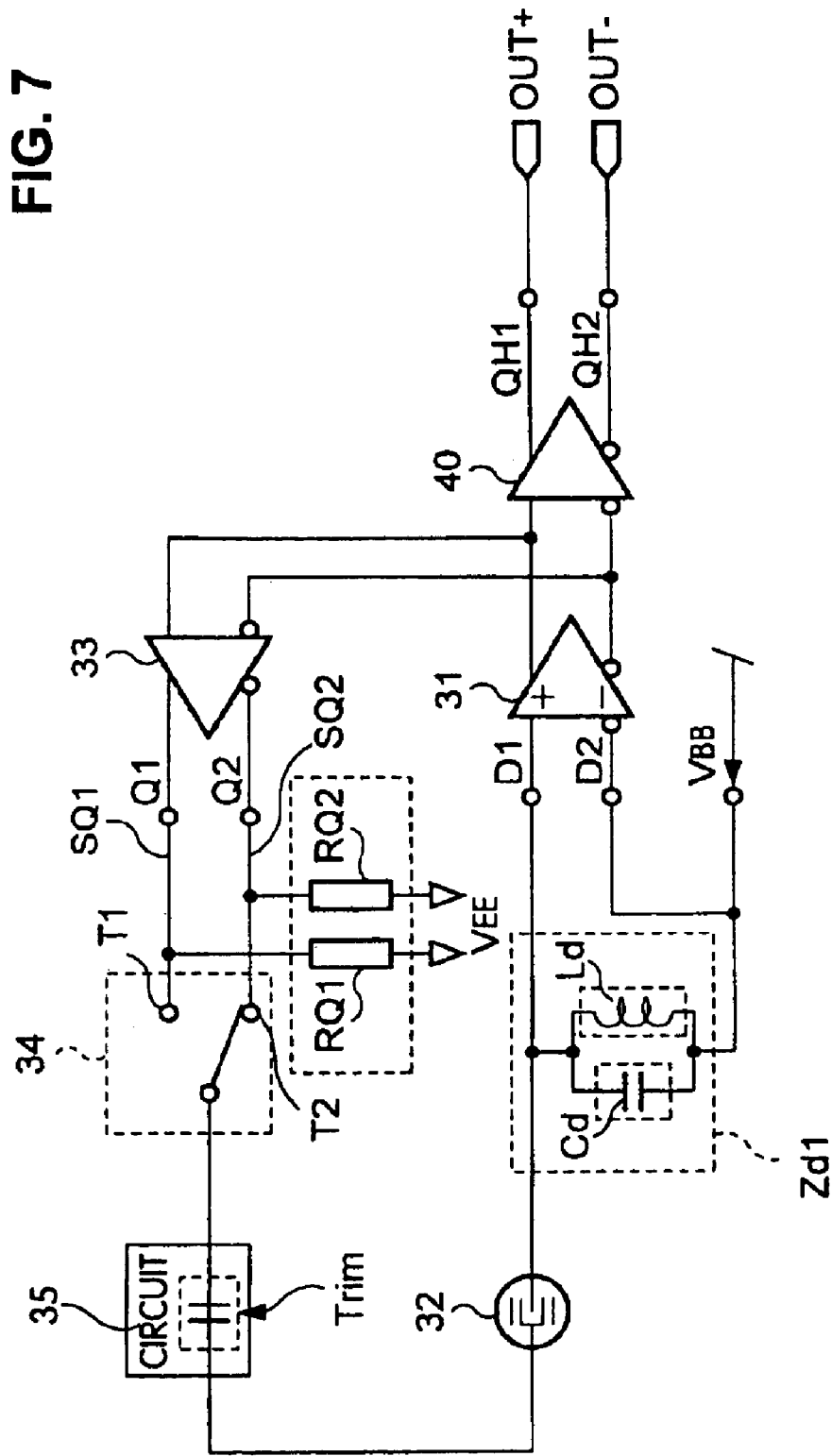
FIG. 7 is a schematic presentation to show the structure of the oscillation circuit of Embodiment 4.

Embodiment 4 explains the fine adjustment of frequency with reference to FIG. 7. Representative techniques for fine adjustment of frequency include the following three.

The phase shift circuit 35 is formed by a condenser that can be laser trimmed, i.e. the electrodes can be abraded by laser and their capacitance can be adjusted. The electrode parts (patterns) forming the condenser are laser trimmed to adjust the condenser capacitance for fine modulation of frequency. A condenser patterned on a board can be used and trimmed in place of the laser trimmable condenser. Similarly, the phase shift circuit 35 can be formed by a condenser and a coil (and a resistor when necessary) to create a low pass filter, high pass filter, or band pass filter. The condenser that is connected to the coil in parallel or in series can be laser trimmed for fine adjustment of the frequency.

As is described with Embodiment 3, the potential difference generator circuit Zd is formed by a frequency selection circuit consisting of a condenser Cd and a coil Ld coupled in parallel. The condenser Cd is created on a semiconductor board and the electrode parts (patterns) forming the condenser Cd are laser trimmed to adjust the condenser capacitance for fine adjustment of the frequency. This condenser Cd serves as a frequency adjustment condenser. This structure prevents defective oscillations and allows frequency fine adjustment as well. Similarly, the condenser Cd can be interposed in series with the coil Ld. Then, the electrode parts (patterns) forming the condenser Cd are laser trimmed to adjust the capacitance.

Resistors RQ1, RQ2 having an appropriate resistance can be connected to the output terminals of the buffer circuit 33 for fine adjustment as required. In this case, the resistors can be trimmed for more precise adjustment.

Embodiment 5

Embodiment 5 of the present invention is hereinafter described. The above Embodiments use the semi-fixed phase shift circuit. Embodiment 5 uses, in place of the semi-fixed phase shift circuit, a voltage controlled phase shift circuit 85 the phase shift rate of which can be varied using an external control voltage VC.

Figure 8:
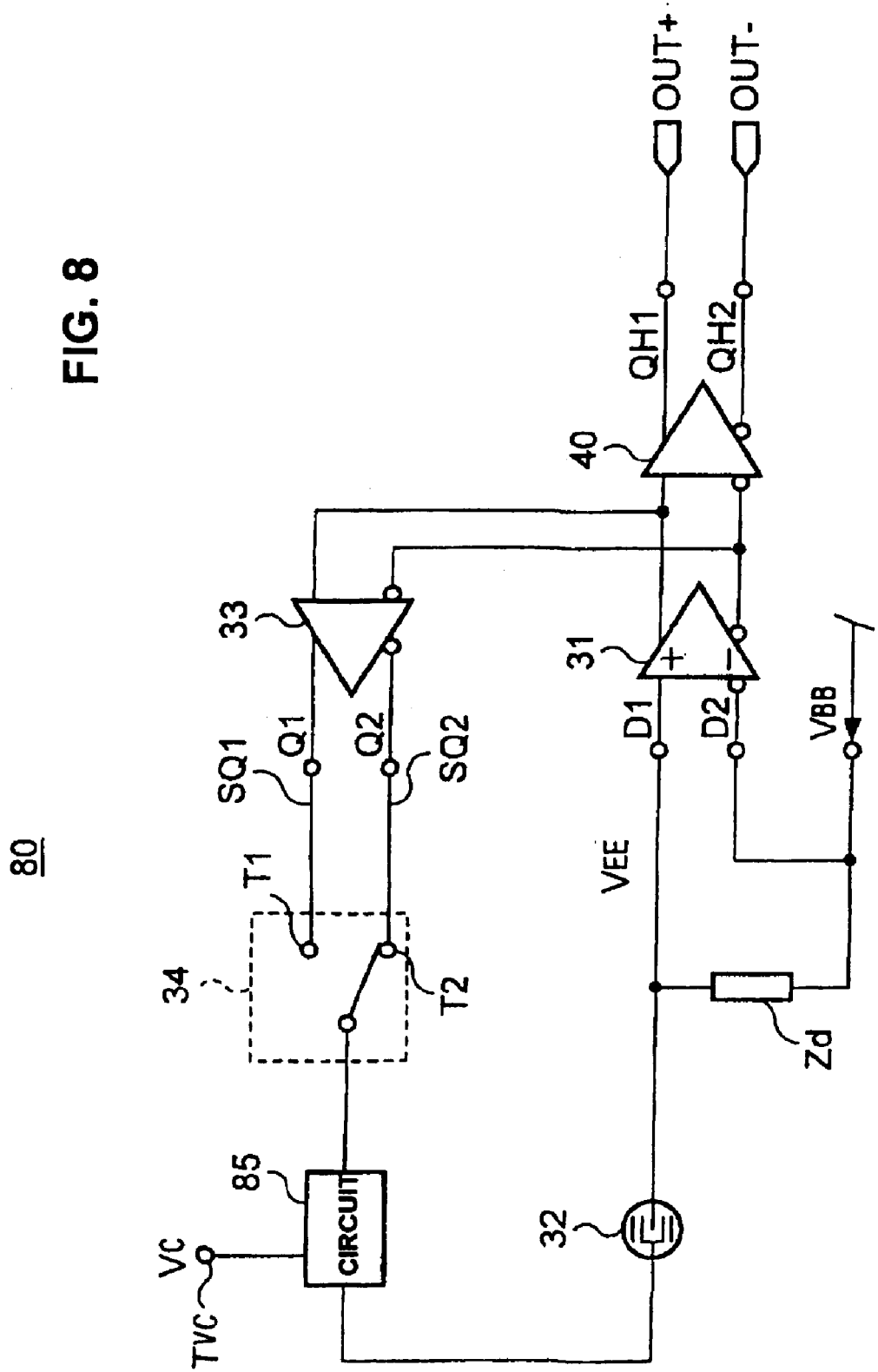
FIG. 8 is a schematic presentation to show the structure of the oscillation circuit of Embodiment 5.

The oscillation circuit 80 of Embodiment 5 is described with reference to FIG. 8. Here, the same reference numbers are given to the same parts as of Embodiment 1 in FIG. 2 and their detailed explanation is eliminated. The embodiment in FIG. 8 differs from Embodiment 1 in FIG. 1 in that a voltage controlled phase shift circuit (phase shift circuit) 85 is provided in place of the phase shift circuit 35.

Its operation is hereinafter described. In the following description, it is assumed that the oscillation circuit 80 has a desired oscillation frequency f0, the phase difference between the signal SQ1 and the required phase for the oscillation circuit 80 is ΔQ1, and the phase difference between the signal SQ2 and the required phase for the oscillation circuit 30 is ΔQ2.

First, the operator compares the phase differences ΔQ1 and ΔQ2 and turns the switch circuit 34 to achieve the least phase shift at the voltage controlled phase shift circuit 85. Then, the control voltage VC is applied to the voltage control terminal Tvc in order for the voltage controlled phase shift circuit 85 to cancel the phase difference ΔQ1 (or the phase difference ΔQ2). Consequently, the feedback loop (positive feedback oscillation loop) consisting of the differential amplifier circuit 31, buffer circuit 33, switch circuit 34, voltage controlled phase shift circuit 85, SAW resonator 32, and potential difference generator circuit Zd satisfies the following phase requirement in which the phase difference between the input and output signals of the differential amplifier circuit 31 is θG and the phase deviation due to the buffer circuit 33, switch circuit 34, phase shift circuit 35, SAW resonator 32, and potential difference generator circuit Zd as well as wiring for connecting these is θβ:

$$\theta G + \theta \beta = 2 \cdot n \cdot \pi (n=0, 1, \ldots)$$

Then, the oscillation circuit 80 is in the oscillation state and produces oscillation reference signals at the non-inverting and inverting output terminals QH1 and QH2.

As is described above, Embodiment 5 uses the voltage controlled phase shift circuit 85 to adjust the phase requirement of the oscillation circuit 80, facilitating the adjustment of the phase requirement. One of the two signals SQ1 and SQ2 that are supplied by the buffer circuit 33 and have different phases from each other is selected to achieve less phase shift at the voltage controlled phase shift circuit 85.

Therefore, the voltage controlled phase shift circuit 35 can be designed to cover a less adjustable phase shift, reducing the circuit in size. The external control voltage VC is used to change the phase shift rate of the voltage controlled phase shift circuit 85 within the range satisfying the expression (3). This also allows fine adjustment of the oscillation frequency of the oscillation circuit 80. In other words, Embodiment 5 can also operate as a voltage controlled oscillation circuit.

Embodiment 6

Figure 9:
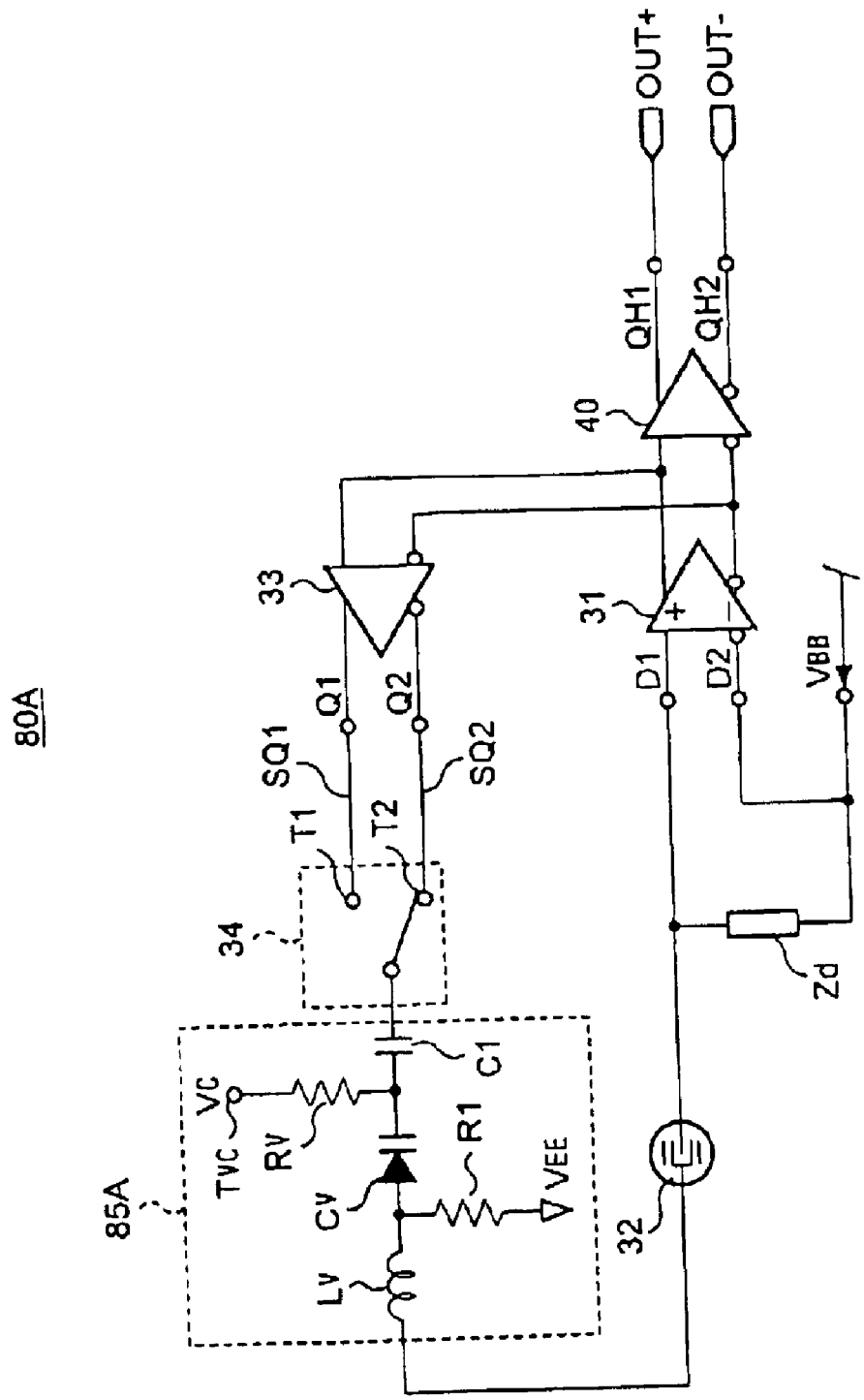
FIG. 9 is a schematic presentation to show the structure of the oscillation circuit of Embodiment 6.

Embodiment 6 of the present invention is hereinafter described. Embodiment 6 is an embodiment of the voltage controlled phase shift circuit 85. FIG. 9 is a schematic presentation to show the structure of the oscillation circuit 80A of Embodiment 6. In FIG. 9, the same reference numbers are given to the same parts as of Embodiment 5 in FIG. 8 and their detailed explanation is eliminated.

In FIG. 9, the voltage controlled phase shift circuit 85A includes a variable capacitance diode Cv, the cathode of which is connected to the voltage control terminal Tvc via an input resistor Rv and the anode of which is connected to a power source VEE via a protective resistor R1. A DC cut condenser C1 is interposed between the cathode of the variable capacitance diode Cv and the switch circuit 34. A coil Lv (frequency selection part) is interposed between the anode of the variable capacitance diode Cv and the SAW resonator 32. With the structure above, when the control voltage VC is applied to the voltage control terminal Tvc, the variable capacitance diode Cv has a varied capacitance and, therefore, the voltage controlled phase shift circuit 85A has a varied phase shift rate. This facilitates adjustment of the phase requirement. The coil Lv is for modulating the entire variable range of the phase shift rate. It can be eliminated when this modulation is unnecessary. The coil Lv can be interposed at any point in the feedback loop.

Embodiment 7

Embodiment 7 is hereinafter described. Embodiment 7 is another embodiment of the voltage controlled phase shift circuit 85 of Embodiment 5.

Figure 10:
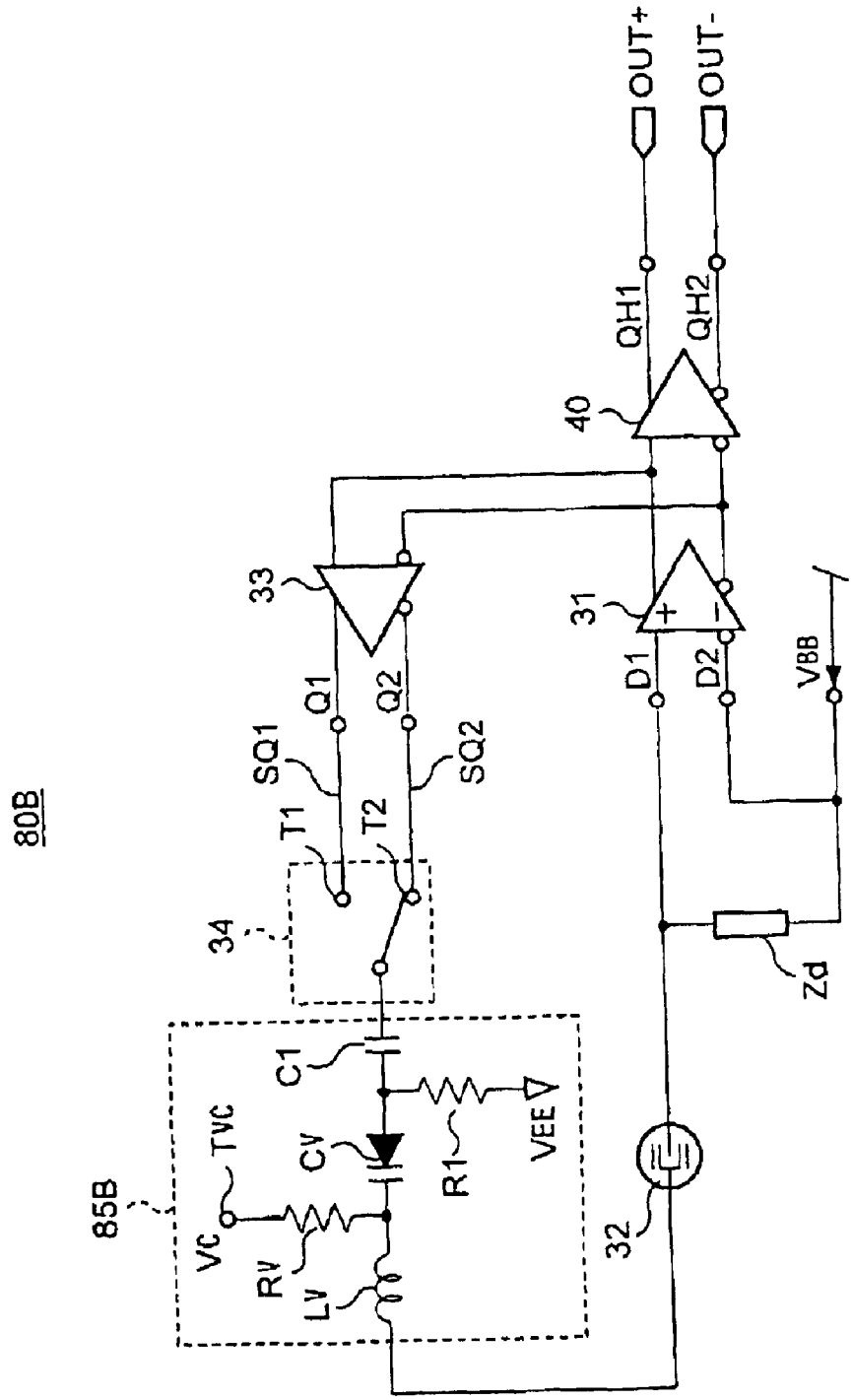
FIG. 10 is a schematic presentation to show the structure of the oscillation circuit of Embodiment 7.

FIG. 10 is a schematic presentation to show the structure of the oscillation circuit 80B of Embodiment 7. In FIG. 10, the same reference numbers are given to the same parts as of Embodiment 5 in FIG. 8 and their detailed explanation is eliminated. In FIG. 10, the voltage controlled phase shift circuit 85B includes a variable capacitance diode Cv, the cathode of which is connected to the voltage control terminal Tvc via an input resistor Rv and the anode of which is connected to a power source VEE via a protective resistor R1. A DC cut condenser C1 is interposed between the anode of the variable capacitance diode Cv and the switch circuit 34. A coil Lv for modulating the entire variable range (modulation range) of the phase shift is interposed between the cathode of the variable capacitance diode Cv and the SAW resonator 32.

With the structure above, when the control voltage VC is applied to the voltage control terminal Tvc as is with Embodiment 6, the variable capacitance diode Cv has a varied capacitance and, therefore, the voltage controlled phase shift circuit 85B has a varied phase shift rate. Applying the control voltage VC to achieve a desired phase shift rate, the phase requirement is easily adjusted.

Embodiment 8

Embodiment 8 is hereinafter described. Embodiment 8 is another embodiment of the voltage controlled phase shift circuit 85 of Embodiment 5.

Figure 11:
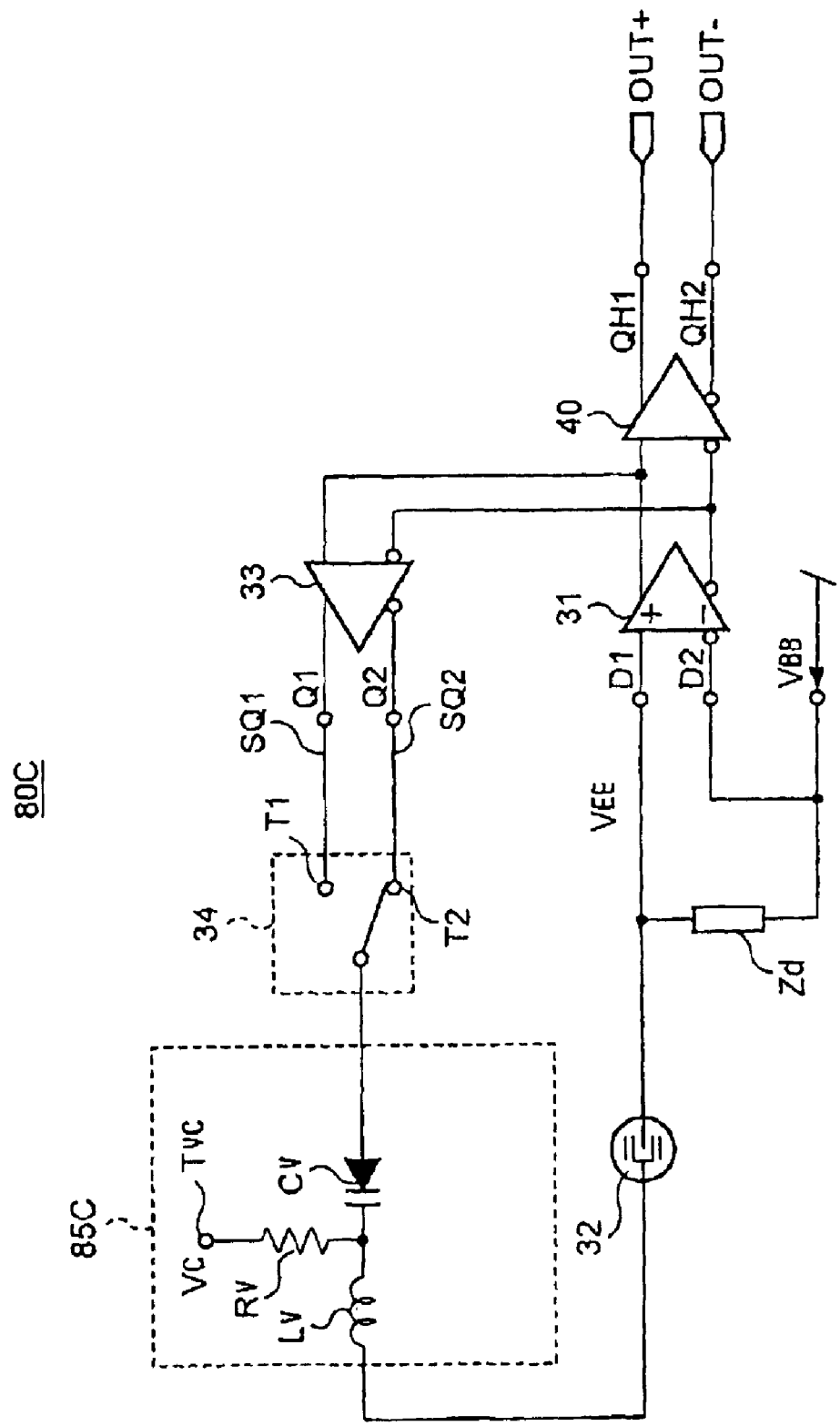
FIG. 11 is a schematic presentation to show the structure of the oscillation circuit of Embodiment 8.

FIG. 11 is a schematic presentation to show the structure of the oscillation circuit 80C of Embodiment 8. In FIG. 11, the same reference numbers are given to the same parts as of Embodiment 5 in FIG. 8 and their detailed explanation is eliminated. In FIG. 11, the voltage controlled phase shift circuit 85C includes a variable capacitance diode Cv, the cathode of which is connected to the voltage control terminal Tvc via an input resistor Rv and the anode of which is connected to the switch circuit 34. A coil Lv for modulating the entire variable range (modulation range) of the phase shift is interposed between the cathode of the variable capacitance diode Cv and the SAW resonator 32.

With the structure above, when the control voltage VC is applied to the voltage control terminal Tvc as is with Embodiment 6, the variable capacitance diode Cv has a varied capacitance and, therefore, the voltage controlled phase shift circuit 85C has a varied phase shift rate. Applying the control voltage VC to achieve a desired phase shift rate, the phase requirement is easily adjusted.

Embodiment 9

Embodiment 9 is hereinafter described. Embodiment 9 is another embodiment of the voltage controlled phase shift circuit 85 of Embodiment 5. Additionally, the SAW resonator 32 and voltage controlled phase shift circuit 85D are switched in the interposed position in the feedback loop and the voltage controlled phase shift circuit 85D also serves as a tank circuit.

Figure 12:
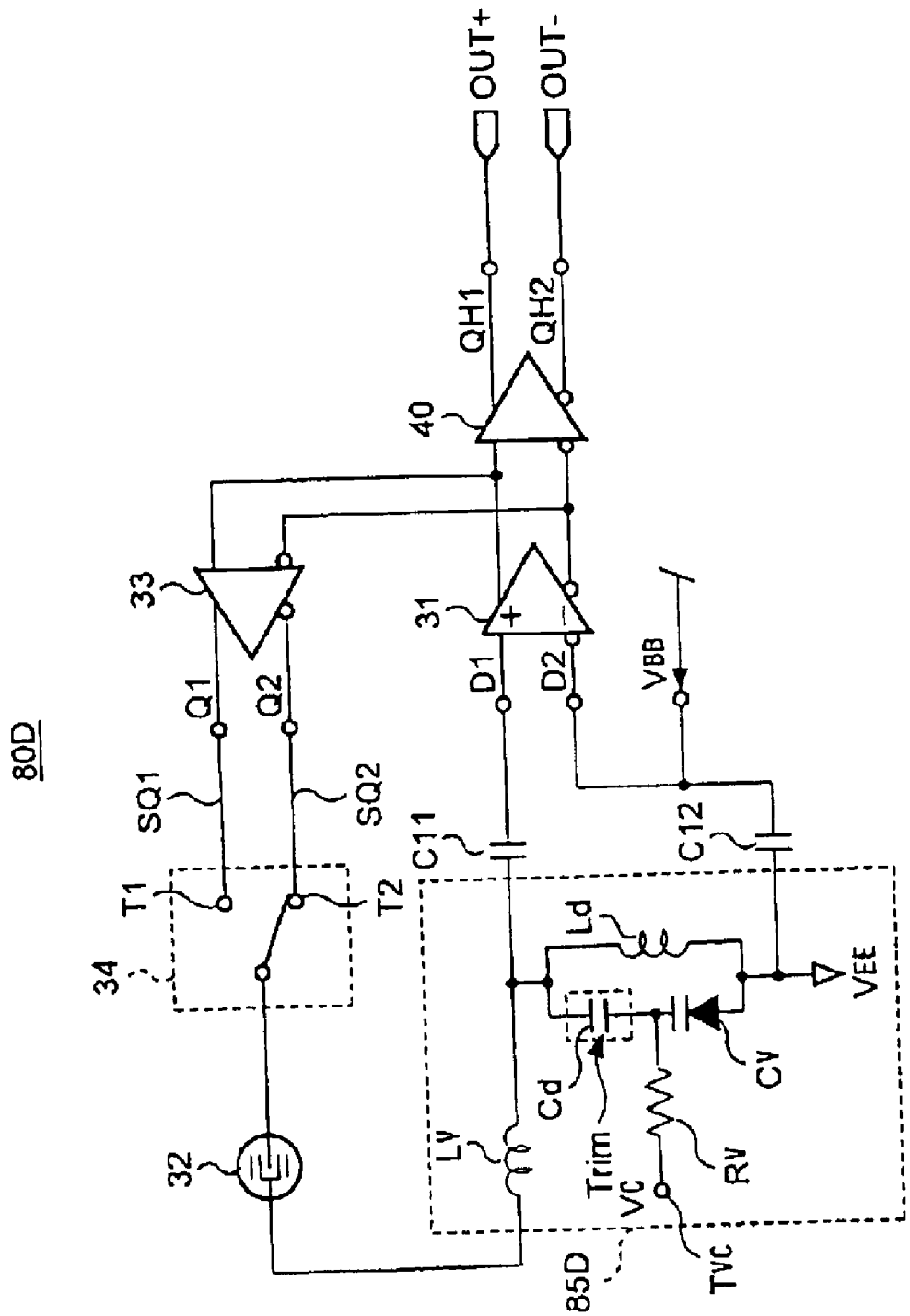
FIG. 12 is a schematic presentation to show the structure of the oscillation circuit of Embodiment 9.

FIG. 12 is a schematic presentation to show the structure of the oscillation circuit 80D of Embodiment 9. In FIG. 12, the same reference numbers are given to the same parts as of Embodiment 5 in FIG. 8 and their detailed explanation is eliminated. In FIG. 12, the voltage controlled phase shift circuit 85D includes a variable capacitance diode Cv, the anode of which is connected to a power source VEE and also connected to the inverting input terminal D2 of the differential amplifier circuit 31 via a DC cut condenser C12.

The cathode of the variable capacitance diode Cv is connected to the voltage control terminal Tvc via an input resistor Rv. The anode is connected to a condenser Cd that serves as a frequency selection circuit in conjunction with the variable capacitance diode Cv and a coil Ld, which is described later. In this case, it is preferred that the variable capacitance diode Cv has larger capacitance than the condenser Cd.

A coil Lv is interposed between the condenser Cd and SAW resonator 32. A coil Ld is connected in parallel with the variable capacitance diode Cv and condenser Cd that are connected in series.

The connection point of the condenser Cd and coil Lv is connected to the non-inverting input terminal D1 of the differential amplifier circuit 31 via a DC cut condenser C11.

With the structure above, when the control voltage VC is applied to the voltage control terminal Tvc as is with Embodiment 6, the variable capacitance diode Cv has a varied capacitance and, therefore, the voltage controlled phase shift circuit 85D has a varied phase shift rate. Applying the control voltage VC to achieve a desired phase shift rate, the phase requirement is easily adjusted.

In Embodiment 9, varying the phase shift rate leads to changing the selected frequency, which is the function of the frequency selection circuit. When high precision is required, laser trimming can be used to trim the condenser Cd to achieve a desired frequency selection range.

Embodiment 10

Figure 13:
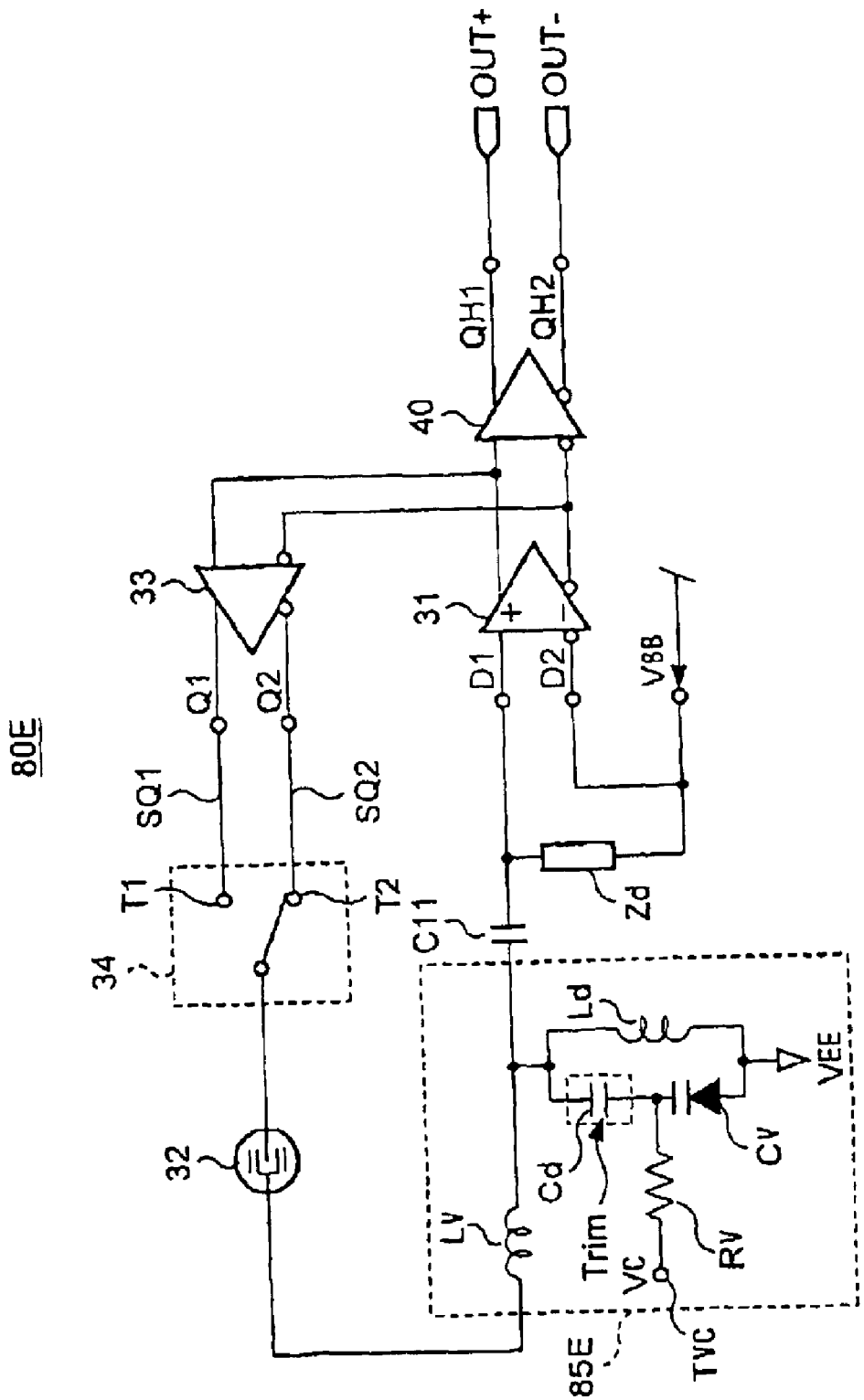
FIG. 13 is a schematic presentation to show the structure of the oscillation circuit of Embodiment 10.

Embodiment 10 is hereinafter described. Embodiment 10 is a modified embodiment of Embodiment 9. FIG. 13 is a schematic presentation to show the structure of the oscillation circuit 80E of Embodiment 10. In FIG. 13, the same reference numbers are given to the same parts as of Embodiment 9 in FIG. 12 and their detailed explanation is eliminated.

The embodiment in FIG. 13 differs from Embodiment 9 in FIG. 12 in that the DC cut condenser C12 is eliminated and a potential difference generator circuit Zd (impedance circuit) is interposed between the DC cut condenser C11 and the inverting input terminal D2 of the differential amplifier 31. With the structure above, when the control voltage VC is applied to the voltage control terminal Tvc of the voltage controlled phase shift circuit 85E as is with Embodiment 9, the variable capacitance diode Cv has a varied capacitance and, therefore, the voltage controlled phase shift circuit 85E has a varied phase shift rate. Applying the control voltage VC to achieve a desired phase shift rate, the phase requirement is easily adjusted.

Also in Embodiment 10, varying the phase shift rate leads to changing the selected frequency, which is the function of the frequency selection circuit. When high precision is required, laser trimming can be used to trim the condenser Cd to achieve a desired frequency selection range.

Embodiment 11

Figure 14:
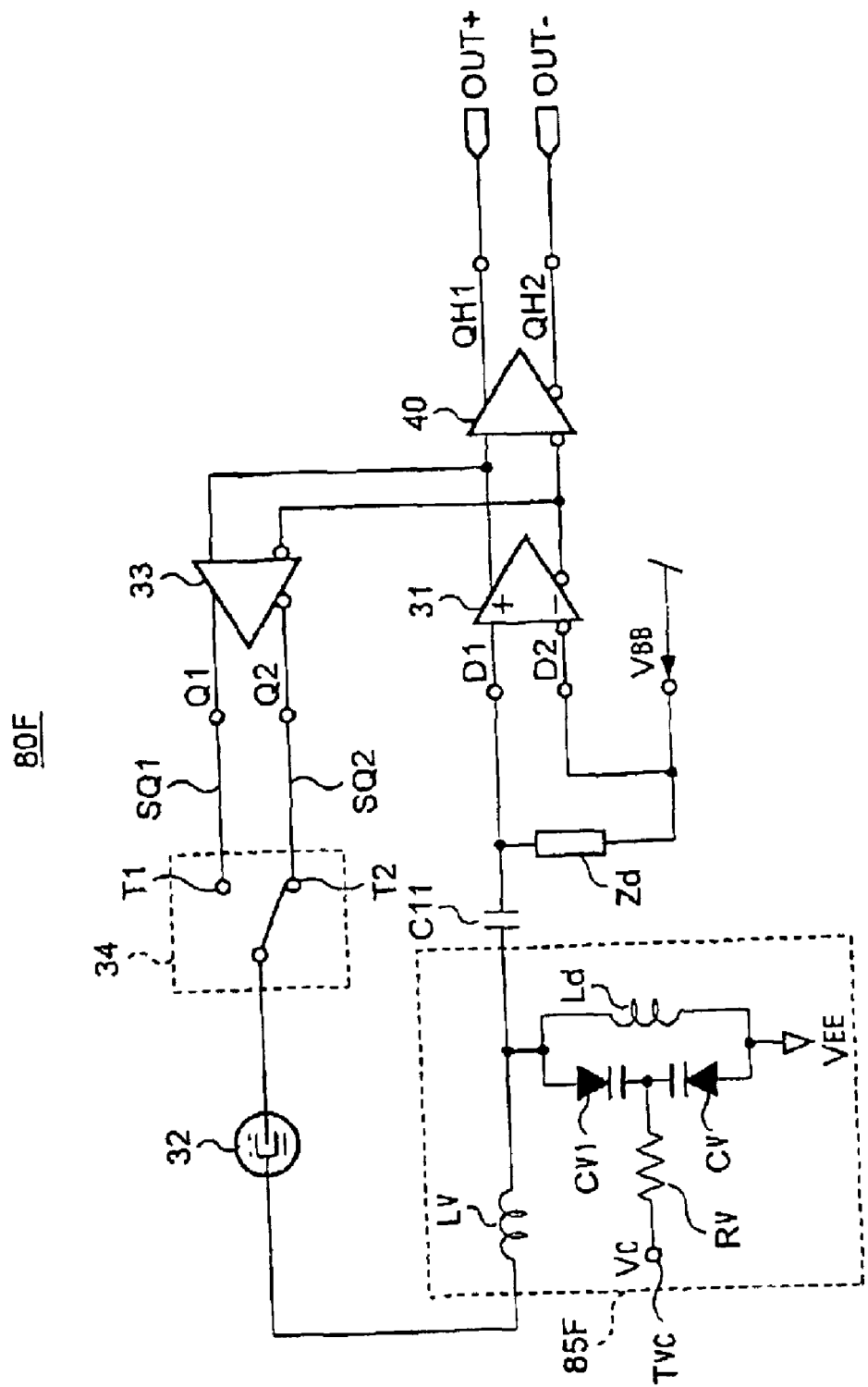
FIG. 14 is a schematic presentation to show the structure of the oscillation circuit of Embodiment 11.

Embodiment 11 is hereinafter described. FIG. 14 is a schematic presentation to show the structure of the oscillation circuit 80F of Embodiment 11. In FIG. 14, the same reference numbers are given to the same parts as of Embodiment 10 in FIG. 13 and their detailed explanation is eliminated. The embodiment in FIG. 14 differs from Embodiment 10 in FIG. 13 in that a second variable capacitance diode Cv1 is provided, the cathode of which is connected to the cathode of the variable capacitance diode Cv, in place of the condenser Cd. Also with the structure above, when the control voltage VC is applied to the voltage control terminal Tvc of the voltage controlled phase shift circuit 85F as is with Embodiment 10, the variable capacitance diodes Cv and Cv1 have a varied capacitance and, therefore, they changes the phase shift rate of the voltage controlled phase shift circuit 85F together.

With the structure above, the combination variety of the variable capacitance diodes Cv and Cv1 allows larger changes in the resultant capacitance. Therefore, the phase shift rate can be adjusted within a larger range. Then, applying the control voltage VC to achieve a desired phase shift rate, the phase requirement is adjusted easily and over a larger range.

Embodiment 12

Figure 15:
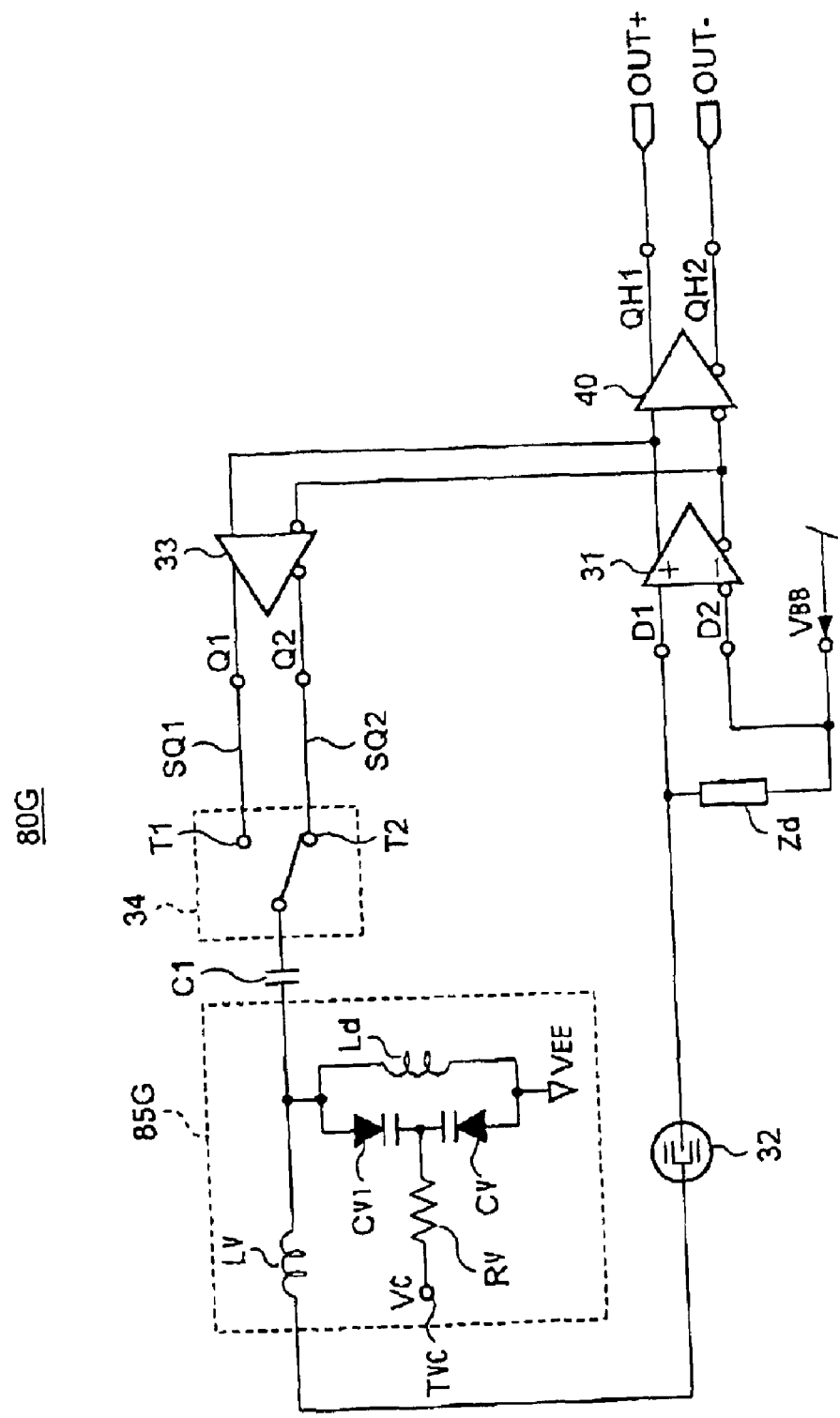
FIG. 15 is a schematic presentation to show the structure of the oscillation circuit of Embodiment 12.

Embodiment 12 is hereinafter described. Embodiment 12 is a modified embodiment of Embodiment 11. FIG. 15 is a schematic presentation to show the structure of the oscillation circuit 80G of Embodiment 12. In FIG. 15, the same reference numbers are given to the same parts as of Embodiment 11 in FIG. 14 and their detailed explanation is eliminated.

The embodiment in FIG. 15 differs from Embodiment 11 in FIG. 14 in that the voltage controlled phase shift circuit and SAW resonator are switched in position and a condenser C11 is interposed between the voltage controlled phase shift circuit and switch circuit 34.

Also with the structure above, when the control voltage VC is applied to the voltage control terminal Tvc of the voltage controlled phase shift circuit 85G as is with Embodiment 11, the variable capacitance diodes Cv and Cv1 have a varied capacitance and, therefore, the voltage controlled phase shift circuit 85G has a varied phase shift rate.

With the structure above, as is with Embodiment 11, the combination variety of the variable capacitance diodes Cv and Cv1 allows larger changes in the resultant capacitance. Therefore, the phase shift rate can be adjusted within a larger range. Then, applying the control voltage VC to achieve a desired phase shift rate, the phase requirement is adjusted easily and over a larger range.

Embodiment 13

Figure 16:
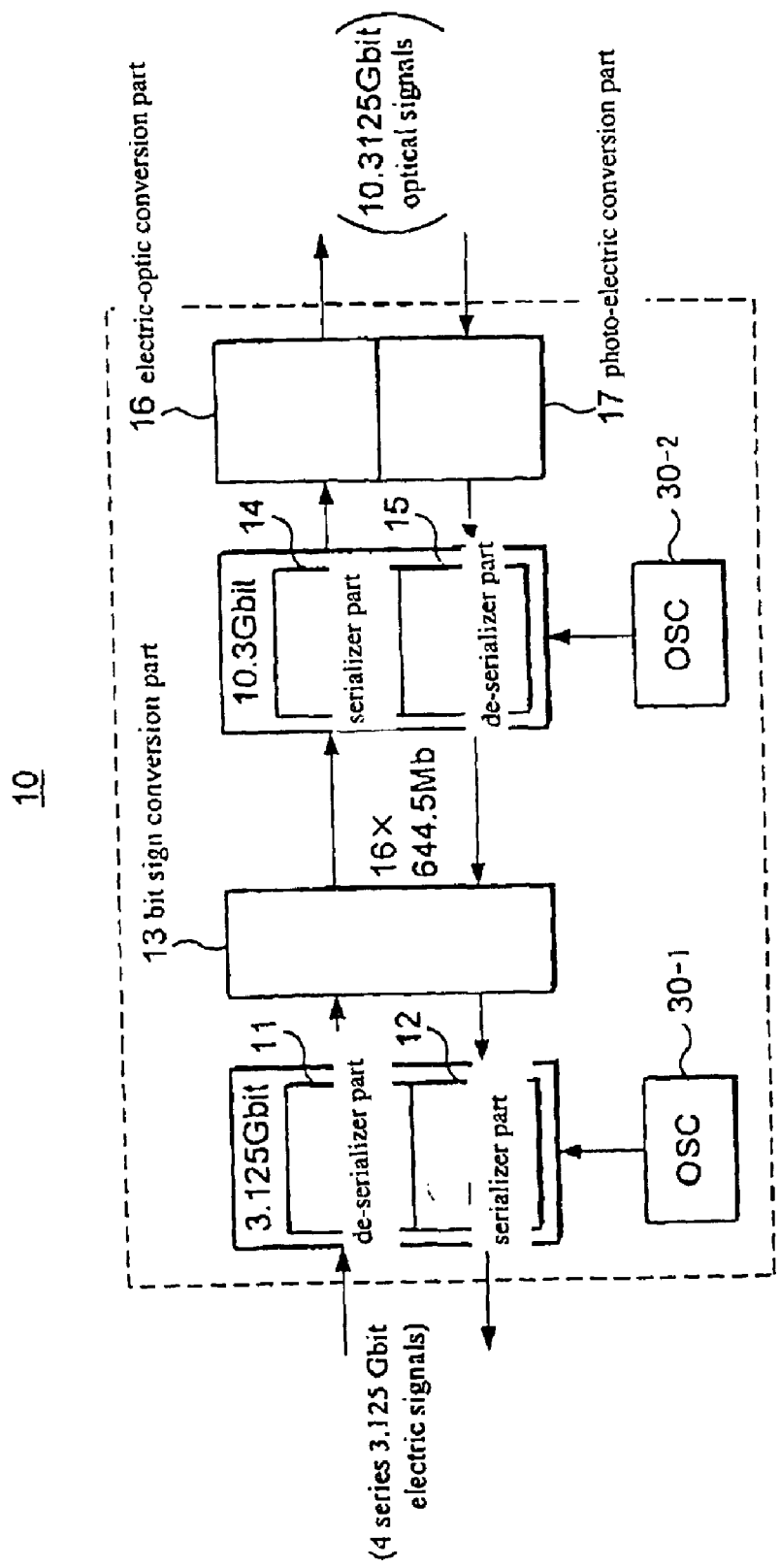
FIG. 16 is a block diagram to show the structure of the optical interface module of Embodiment 13.

Embodiment 13 is hereinafter described. FIG. 16 is a schematic presentation to show the structure of an optical interface module for 10.3125 gigabit optical networks in which the feedback oscillation circuit of Embodiment 1 is used. The optical interface module 10 has an interface function for photo-electro or electro-photo conversion, for instance, between the server computer and optical networks.

As is shown in FIG. 16, two positive feedback type oscillation circuit 30-1 and 30-2 that are identical to the oscillation circuit 30 of Embodiment 1 are used to provide reference signals to 3.125 gigabit de-serializer 11 and serializer 12 as well as to 10.3125 gigabit serializer 14 and de-serializer 15, which are connected to each other via decode and encode 13.

The Serializer 14 is connected to an electric-optic conversion part 16. The electric-optic conversion part 16 performs electric-optic conversion of input data to send them onto optical networks. The De-serializer 15 is connected to a photo-electric conversion part 17. The photo-electric conversion part 17 performs photo-electric conversion of input data from optical networks and transmits them to the de-serializer 15.

As is described above, Embodiment 13 selects one of the two signals SQ1 and SQ2 that are output from the buffer circuit 33 and have different phases from each other for less phase shift rate at the phase shift circuit 35.

Therefore, the adjustable phase shift rate at the phase shift circuit 35 can be set for the least and, therefore, the phase shift circuit 35 can be reduced in size. Consequently, the interface module for phase optical networks can have a reduced circuit size. Furthermore, this can reduce the influence of deviation in the phase shift circuit 35 on products. This facilitates building of high speed networks such as 10 gigabits Ethernet that allows mass data transmission, for instance, of motion pictures. The case in which the oscillation circuit of Embodiment 1 is used is described above. The same result can be obtained using the oscillation circuits of Embodiments 2 to 12.

Modified Embodiments

Modified Embodiment 1

In the description above, when plural buffer circuits are used, they are provided in parallel. However, plural buffer circuits can be connected in series and the output terminal of one of the buffer circuits can be connected to the input of the phase shift circuit. This allows the phase shift rate to shift stepwise by addition, easily realizing different phase shift rates.

Modified Embodiment 2

In the description above, input signals are supplied to the non-inverting input terminal D1 and the bias voltage VBB is applied to the inverting input terminal D2 of the differential amplifier. However, input signals can be supplied to the inverting input terminal D2 and the bias voltage VBB can be applied to the non-inverting input terminal D1 of the differential amplifier.

Modified Embodiment 3

In the description above, the case in which the oscillation circuit is used for a network optical interface module is described. However, the oscillation circuit has applications in various electronic devices such as cellular phones and wireless communication devices where an oscillation circuit, particularly high frequency oscillation circuit is required.

Modified Embodiment 4

In the description above, in principle, a closed loop (positive feedback oscillation loop) is formed by the SAW resonator or quartz crystal AT resonator (piezoelectric resonator)->differential amplifier (differential amplifier)->buffer circuit (feedback buffer circuit)->switch circuit (signal selection part)->phase shift circuit (or voltage controlled phase shift circuit), which are arranged in this order. However, the SAW resonator or quartz crystal AT resonator, differential amplifier, and phase shift circuit (or voltage controlled phase shift circuit) can be disposed at any point in the closed loop.

Modified Embodiment 5

In the description above, one phase shift circuit or voltage controlled phase shift circuit is used. However, any number of them can be provided. In such case, one of them can be selected or they can be coupled in series.

Modified Embodiment 6

In the description above, the case in which the oscillation source is a piezoelectric resonator (SAW resonator, AT cut quartz crystal resonator) is described. A piezoelectric filter can be used to obtain the same effect in place of the piezoelectric resonator.

Modified Embodiment 7

In the description above, the differential amplifier and buffer are not described in detail. The differential amplifier and buffer circuits (feedback buffer circuit and output buffer circuit) preferably consist of a differential amplifier using an ECL (emitter coupled logic) line receiver.

This is because the ECL line receiver suits in high speed operations of high speed digital communication and saves a lot of power consumption.

Figure 17:
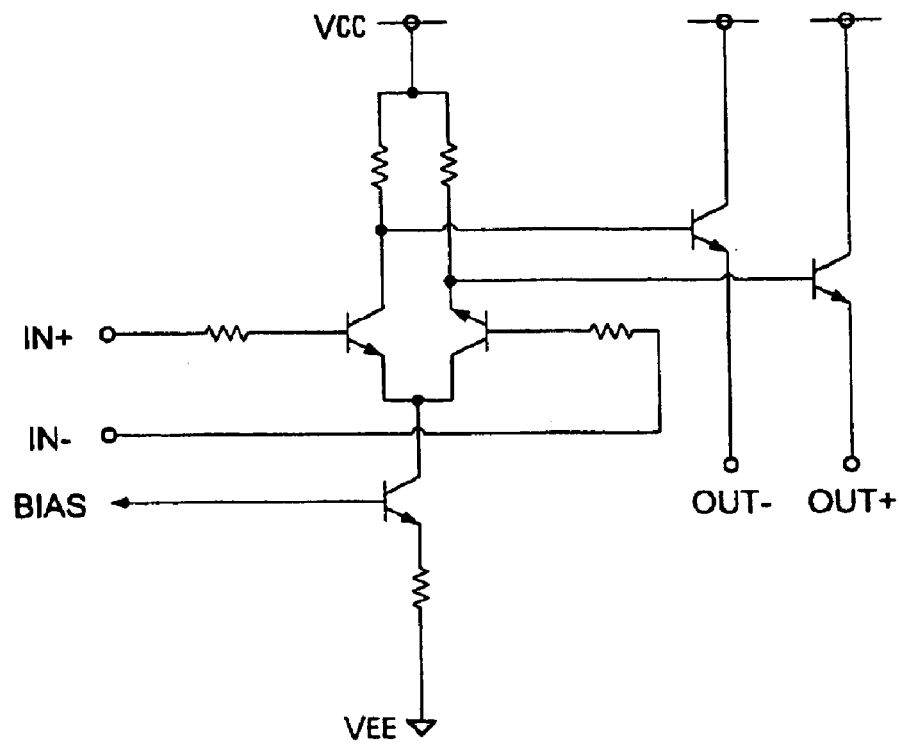
FIG. 17 is a basic circuit diagram of an ECL line receiver.
Figure 18:
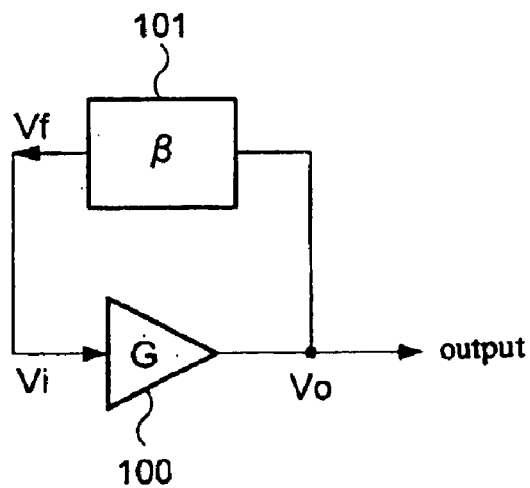
FIG. 18 is a presentation to show the principle of a feedback type oscillator.

The ECL line receiver has the structure of a basic circuit shown in FIG. 17, comprising a non-inverting input terminal (IN+), an inverting input terminal (IN−), a bias voltage terminal (BIAS), a non-inverting output terminal (OUT+), and an inverting output terminal (OUT−). A certain bias voltage being applied to the bias voltage terminal (BIAS), the ECL line receiver serves as a ECL differential amplifier that produces, at the non-inverting (OUT+) and inverting (OUT−) output terminals, output signals having a certain phase shift that corresponds to the voltage difference between the signals supplied to the non-inverting (IN+) and inverting (IN−) input terminals.

The ECL line receiver is used to transform signals including sign wave signals from other oscillation circuits or amplifiers or other general signals into electric levels that are used by the ECL circuit.

As is described above, using the ECL line receiver for the differential amplifier of the oscillation circuit facilitates acquiring of ECL electric level frequency signal outputs.

Modified Embodiment 8

In the description above, piezoelectric materials for the SAW resonator is not described in detail. In addition to quartz crystal, langacyto and LBO (Lithium Tetraborate) can be also used.

Modified Embodiment 9

In the description above, the frequency selection part serves as BPF (Band Pass Filter) that selectively passes a certain frequency band component of the output signals from the phase shift circuit. It can also serve as BEF (Band Elimination Filter) that selectively blocks a certain frequency band component of the output signals from the phase shift circuit.

The present invention provides an oscillation circuit that ensures loop gain and efficient oscillation without size enlargement of the phase shift circuit. Similar circuit configuration can be used for oscillation circuits having a piezoelectric resonator having a different resonation frequency although the positive feedback oscillation loop is reversed, facilitating designing the circuit.

Using an ECL line receiver as the differential amplifier facilitates obtaining of the ECL electric level frequency signal outputs.

What is claimed is:

1. An oscillation circuit comprising:

a differential amplifier having a plurality of output terminals providing output signals having different phases from each other;

a piezoelectric device; and a phase shift circuit transmitting output signals that result from a predetermined phase shift of input signals;

wherein the differential amplifier, piezoelectric device, and phase shift circuit form a positive feedback oscillation loop; and wherein a signal selection part for selecting one of the output terminals of the differential amplifier is provided, the positive feedback oscillation loop being completed with one of the output terminals of the differential amplifier.

2. The oscillation circuit according to claim 1 wherein:

the differential amplifier further comprises a differential amplifier having an ECL line receiver.

3. The oscillation circuit according to claim 1 wherein:

the differential amplifier includes an inverting input terminal and a non-inverting input terminal;

the inverting and non-inverting input terminals being connected to one another via an impedance circuit; and a bias voltage is applied to one of the inverting and non-inverting input terminals and the other serves as the input terminal of the positive feedback oscillation loop.

4. The oscillation circuit according to claim 3 wherein:

the impedance circuit further comprises a tank circuit having an inductor and a capacitor; and the tank circuit selectively passes a desired frequency band of the output signals from the phase shift circuit.

5. The oscillation circuit according to claim 4 wherein:

the piezoelectric resonator further comprises a quartz crystal AT cut resonator;

the tank circuit selectively passes at least one of an odd order overtone oscillation frequency band of the quartz crystal AT cut resonator and a desired oscillation frequency band of the output signal.

6. The oscillation circuit according to claim 1 wherein:

a frequency selection part is provided that selectively passes certain frequency band components of the output signals from the phase shift circuit.

7. The oscillation circuit according to claim 6 wherein:

the frequency selection part has a frequency selection condenser and a frequency selection coil that are connected in parallel.

8. The oscillation circuit according to claim 7 wherein:

the frequency selection condenser has a variable capacitance which selectively passes the frequency band components of the output signals from the phase shift circuit.

9. The oscillation circuit according to claim 7 wherein:

the frequency selection condenser further comprises a laser trimmed condenser.

10. The oscillation circuit according to claim 7 wherein:
the frequency selection condenser further comprises a laser trimmed condenser that is patterned on a board.

11. The oscillation circuit according to claim 1 wherein:
a frequency selection part is provided that selectively blocks frequency band components of the output signals from the phase shift circuit.

12. The oscillation circuit according to claim 11 wherein:
the frequency selection part further comprises a variable capacitance condenser provided in the phase shift circuit.

13. The oscillation circuit according to claim 12 wherein:
the variable capacitance condenser further comprises a laser trimmed condenser.

14. The oscillation circuit according to claim 12 wherein:
the variable capacitance condenser further comprises a laser trimmed condenser that is patterned on a board.

15. The oscillation circuit according to claim 1 wherein:
an output buffer circuit having an output differential amplifier is interposed on the output terminal side of the differential amplifier.

16. The oscillation circuit according to claim 15 wherein:
the output differential amplifier further comprises a differential amplifier having an ECL line receiver.

17. The oscillation circuit according to claim 1 wherein:
a feedback buffer circuit having a feedback differential amplifier with a plurality of output terminals that provide output signals having different phases from each other is interposed in the positive feedback oscillation loop.

18. The oscillation circuit according to claim 17 wherein:
the feedback buffer circuit has a plurality of the feedback differential amplifiers that have any of the plurality of output terminals and are connected in parallel; and
one of the plurality of feedback differential amplifiers is interposed in the positive feedback oscillation loop.

19. The oscillation circuit according to claim 17 wherein:
the feedback buffer circuit has a plurality of the feedback differential amplifiers that are connected in series; and
at least one of the feedback differential amplifiers is interposed in the positive feedback oscillation loop.

20. The oscillation circuit according to claim 18 wherein:
each of the feedback differential amplifiers has irregular phase shifts for output signals.

21. The oscillation circuit according to claim 18 wherein:
each of the feedback differential amplifiers has regular phase shifts for output signals.

22. The oscillation circuit according to claim 17 wherein:
the feedback differential amplifier further comprises a differential amplifier having an ECL line receiver.

23. The oscillation circuit according to claim 1 wherein:
the signal selection part performs the selection for a lesser phase shift at the phase shift circuit.

24. The oscillation circuit according to claim 1 wherein:
the phase shift circuit further comprises a voltage controlled phase shift circuit in which the phase shift rate is varied by applied control voltage.

25. The oscillation circuit according to claim 1 wherein:
the piezoelectric resonator further comprises a SAW resonator.

26. The oscillation circuit according to claim 25 wherein:
the SAW resonator further comprises any one of quartz crystal, langasite, and LBO (Lithium Tetraborate).

27. The oscillation circuit according to claim 1 wherein:
the piezoelectric resonator further comprises a quartz crystal AT cut oscillator.

28. An electronic device wherein the oscillation circuit according to claim 1 is provided.

29. The circuit of claim 1 wherein the piezoelectric device is a resonator.

30. The circuit of claim 1 wherein the piezoelectric device is a filter.

31. An oscillation circuit comprising:
a differential amplifier having a plurality of output terminals providing output signals having different phases from each other;
a piezoelectric filter; and
a phase shift circuit transmitting output signals that result from a predetermined phase shift of input signals;
wherein the differential amplifier, piezoelectric filter, and phase shift circuit form a positive feedback oscillation loop; and
wherein a signal selection part for selecting one of the output terminals of the differential amplifier is provided, the positive feedback oscillation loop being completed with one of the output terminals of the differential amplifier.

* * * * *

UNITED STATES PATENT AND TRADEMARK OFFICE
CERTIFICATE OF CORRECTION

PATENT NO. : 6,778,030 B2
DATED : August 17, 2004
INVENTOR(S) : Yoshihiro Kobayashi and Nobuyuki Imal It is certified that error appears in the above-identified patent and that said Letters Patent is hereby corrected as shown below:

<u>Column 4,</u>
Line 56, "A" should be -- An --.

<u>Column 11,</u>
Line 38, "changes" should be -- change --

Signed and Sealed this

Nineteenth Day of July, 2005

JON W. DUDAS
*Director of the United States Patent and Trademark Office*